(12) United States Patent
Kim

(10) Patent No.: US 8,105,918 B2
(45) Date of Patent: Jan. 31, 2012

(54) SEMICONDUCTOR DEVICE AND METHOD OF FABRICATING THE SAME INCLUDING FORMING PILLAR NECK PATTERNS

(75) Inventor: Myung-Ok Kim, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 277 days.

(21) Appl. No.: 12/318,176

(22) Filed: Dec. 23, 2008

(65) Prior Publication Data
US 2009/0250748 A1 Oct. 8, 2009

(30) Foreign Application Priority Data
Apr. 4, 2008 (KR) .................. 10-2008-0031476

(51) Int. Cl.
*H01L 21/20* (2006.01)
*H01L 21/36* (2006.01)
*H01L 21/3205* (2006.01)
*H01L 21/4763* (2006.01)

(52) U.S. Cl. ...................................... 438/478; 438/585

(58) Field of Classification Search .................. 438/478, 438/585; 257/E21.19, E21.461, E29.262
See application file for complete search history.

(56) References Cited

U.S. PATENT DOCUMENTS

| 6,426,259 B1 * | 7/2002 | Yu ................................ 438/269 |
| 2004/0061156 A1 * | 4/2004 | Cha .............................. 257/295 |
| 2004/0183142 A1 | 9/2004 | Matsuo et al. |
| 2007/0210403 A1 * | 9/2007 | Sandhu .......................... 257/499 |

FOREIGN PATENT DOCUMENTS

| CN | 1638087 | 7/2005 |
| JP | 08-330586 | 12/1996 |
| KR | 1020030058633 | 7/2003 |
| KR | 1020050111951 | 11/2005 |
| KR | 1020070038233 | 4/2007 |

OTHER PUBLICATIONS

Chinese Office Action for application No. 200910000355.X.
Chinese Patent Certificate and Publication of Granted Chinese invention dated Jul. 27, 2011 for application No. 101552194.
Korean Office Action dated Apr. 27, 2011 for Korean application No. 10-2008-0031476.
Korean Notice of Allowance for 10-2008-0031476 dated Nov. 9, 2011, citing the above reference(s).

\* cited by examiner

*Primary Examiner* — William M. Brewster
(74) *Attorney, Agent, or Firm* — Lowe Hauptman Ham & Berner LLP

(57) ABSTRACT

A semiconductor device and method of fabricating the same includes preparing a substrate, forming a plurality of conductive layer patterns on the substrate, forming a gate insulation layer on sidewalls of the conductive layer patterns, forming a pillar neck pattern between the conductive layer patterns, forming a pillar head over the pillar neck pattern and the conductive layer patterns, and forming a gate electrode surrounding the pillar neck pattern and forming a pillar head pattern by selectively etching the conductive layer patterns and the pillar head formed over the pillar neck pattern.

14 Claims, 9 Drawing Sheets

21

22

I-I'

EPITAXIAL GROWTH

I-I'

I-I'

SEMICONDUCTOR DEVICE AND METHOD OF FABRICATING THE SAME INCLUDING FORMING PILLAR NECK PATTERNS

CROSS-REFERENCE TO RELATED APPLICATIONS

The present application claims priority of Korean patent application number 10-2008-0031476, filed on Apr. 4, 2008, which is incorporated herein by reference in its entirety.

BACKGROUND

The disclosure relates to a semiconductor device, and more particularly, to a semiconductor device having vertical channels formed in a top-to-bottom direction, which will be referred to as vertical channels hereafter, and method of fabricating the same.

As integration degree of semiconductor devices increases, semiconductor devices having vertical channel formed in a top-to-bottom direction realize a $4F^2$ structure to improve cell efficiency.

FIG. 1 is a diagram illustrating an exemplary semiconductor device having channels formed in a top-to-bottom direction.

Referring to FIG. 1, the depicted embodiment of a semiconductor device includes a substrate 10, a pillar pattern having a pillar head 11 and a pillar neck 12, a gate hard mask layer 13 for protecting an upper portion of the pillar pattern, a sidewall passivation layer 14 for protecting a sidewall of the pillar head 11, a gate insulation layer 15 surrounding the pillar neck 12, and a gate electrode 16. A source and a drain are formed at the pillar head 11 and the substrate 10, and a channel is formed at the pillar neck 12 through the source and the drain.

However, because the pillar neck 12 of the pillar pattern has a diameter smaller than that of the pillar head 11, and the gate hard mask layer 13 is disposed over the pillar head 11, the pillar pattern sometimes tips to the side or falls down as shown in FIG. 2. Sometimes also due to this structure, adjacent pillar patterns adhere together. Likewise, the pillar pattern sometimes falls down because the pillar neck 12 with a smaller diameter is formed after forming the pillar head 11.

When the pillar head 11 and the pillar neck 12 are etched without an etch stop layer, often the heights of the pillar patterns are not uniform as shown in FIG. 3.

When a gap between the pillar patterns is filled with a conductive layer to form the gate electrode 16, often a void 21 and a seam are formed in the conductive layer due to a high aspect ratio between the pillar patterns as shown in FIG. 4. If the conductive layer is patterned after filling the gap, a punch problem 22 arises due to an etch speed difference caused by the void 21 and the seam. Here, the punch problem 22 attacks the gate insulation layer 15 and the substrate 10 as shown in FIG. 5. Furthermore, the sidewall passivation layer 14 is sometimes damaged due to an etch selectivity in the patterning of the conductive layer as shown in FIG. 6. Consequently, the pillar head 11 is damaged.

SUMMARY

One or more embodiments are a semiconductor device that prevents a fall-down problem of a pillar pattern, and a method of fabricating the same.

One or more embodiments are a semiconductor device that prevents a substrate damage problem caused by a conductive layer having voids and seams, and a method of fabricating the same.

In accordance with one or more embodiments, a method for fabricating a semiconductor device includes preparing a substrate, forming a plurality of conductive layer patterns on the substrate, forming a gate insulation layer on sidewalls of the conductive layer patterns, forming a pillar neck pattern between the conductive layer patterns, forming a pillar head over the pillar neck pattern and the conductive layer patterns, and forming a gate electrode surrounding the pillar neck pattern and forming a pillar head pattern by selectively etching the conductive layer patterns and the pillar head formed over the pillar neck pattern.

In accordance with one or more embodiments, a method for fabricating a semiconductor device includes preparing a substrate, forming a first etch stop layer, a conductive layer, a second etch stop layer pattern, and a plurality of hard mask patterns, forming a plurality of opening regions by etching the second etch stop layer, the conductive layer, and the first etch stop layer using the plurality of hard mask patterns as an etch barrier, removing the plurality of hard mask patterns, forming a gate insulation layer on sidewalls defining the plurality of opening regions, forming a plurality of pillar patterns in the plurality of opening regions, forming a gate hard mask pattern that covers a portion of the conductive layer and the plurality of pillar patterns, and forming a gate electrode surrounding each of the plurality of pillar pattern by etching the conductive layer between each of the plurality of pillar patterns using the gate hard mask pattern.

In accordance with one or more embodiments, a semiconductor device includes a substrate, a plurality of conductive layer patterns on the substrate, a gate insulation layer on sidewalls of the conductive layer patterns, a pillar neck pattern between the conductive layer patterns, a pillar head over the pillar neck pattern and the conductive layer patterns, and a gate electrode surrounding the pillar neck pattern and a pillar head pattern.

In accordance with one or more embodiments, a semiconductor device includes a substrate, a first etch stop layer, a conductive layer, and a second etch stop layer pattern, a plurality of opening regions, a gate insulation layer on sidewalls defining the plurality of opening regions, a plurality of pillar patterns in the plurality of opening regions, and a gate electrode surrounding each of the plurality of pillar patterns.

BRIEF DESCRIPTION OF THE DRAWINGS

Various embodiments are illustrated by way of example, and not by limitation, in the figures of the accompanying drawings.

DESCRIPTION OF EMBODIMENTS

Figure 1:
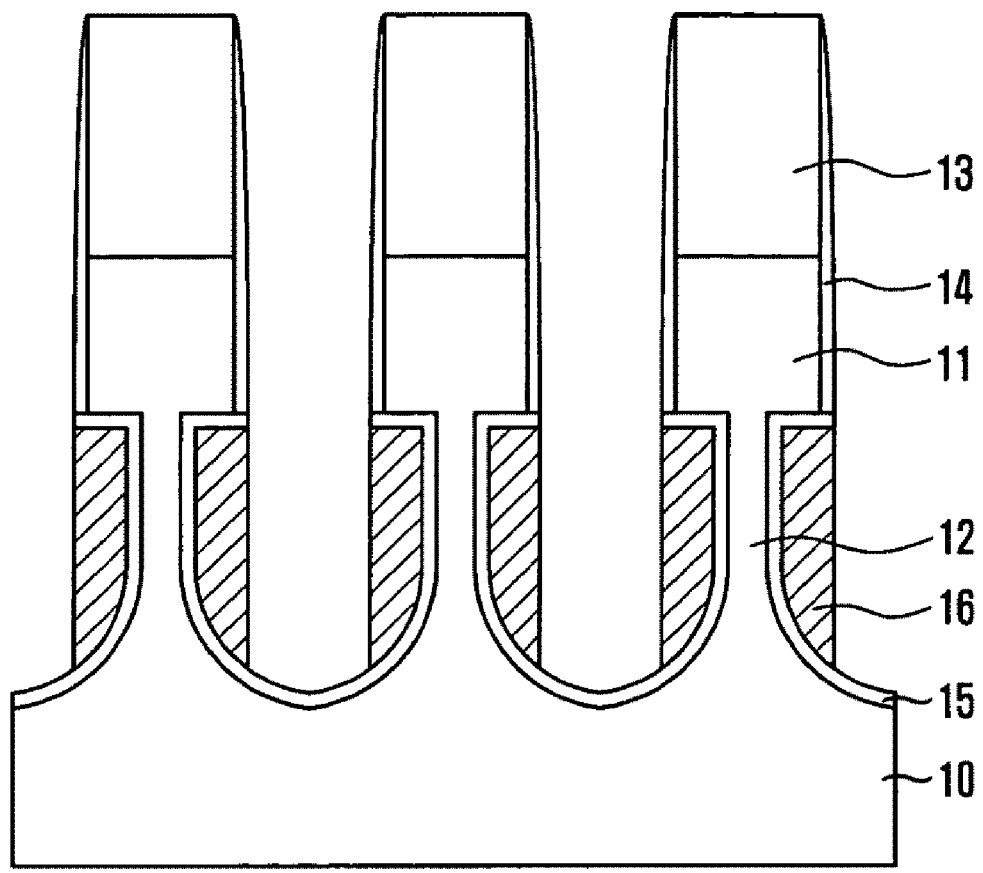
FIG. 1 is a diagram illustrating an exemplary semiconductor device having channels formed in a top-to-bottom direction.
Figure 2:
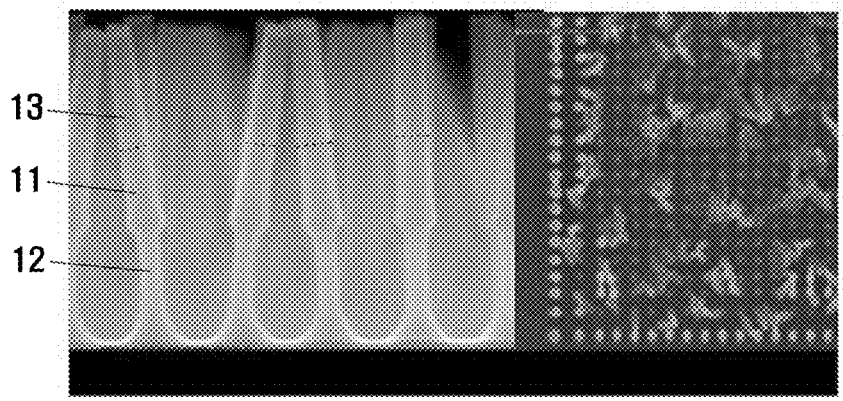
FIG. 2 is an electron microscopic picture showing adjacent pillar patterns adhered together.
Figure 3:
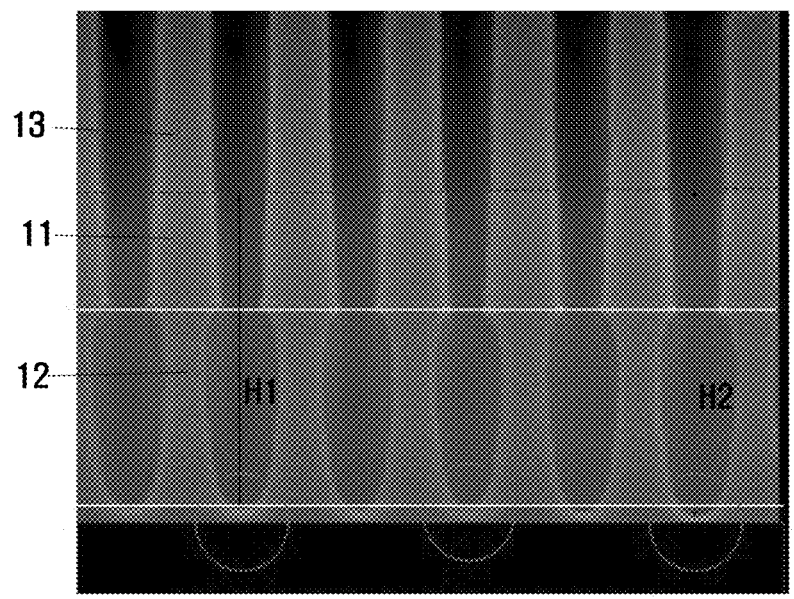
FIG. 3 is an electron microscopic picture showing pillar patterns having irregular heights.
Figure 4:
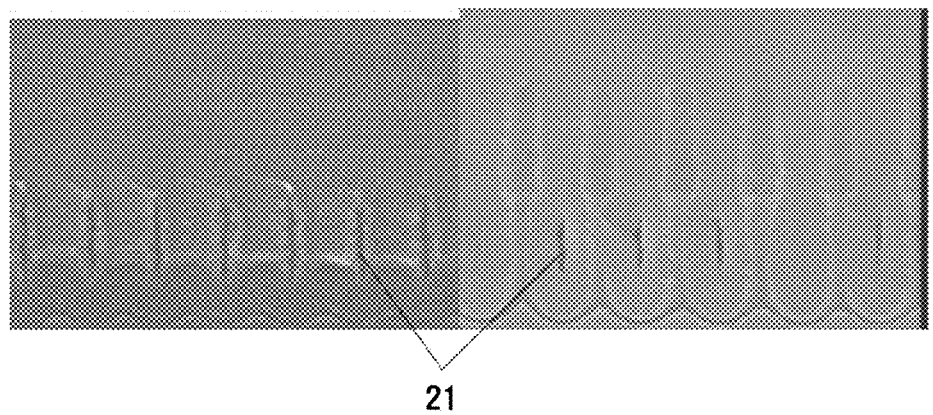
FIG. 4 is an electron microscopic picture showing a conductive layer having voids and seams formed therein due to a high aspect ratio between pillar patterns.
Figure 5:
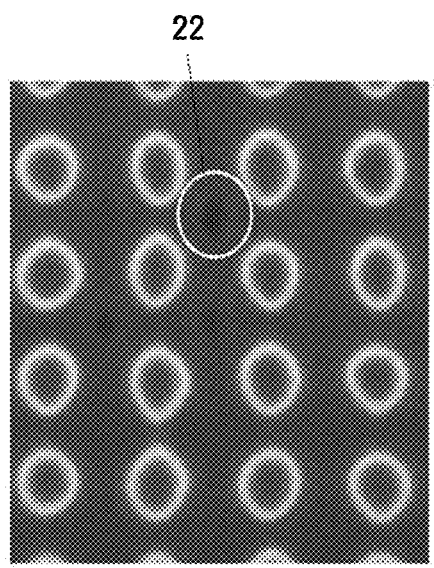
FIG. 5 is an electron microscopic picture showing a gate insulation layer with an underlying substrate layer punched therethrough.
Figure 6:
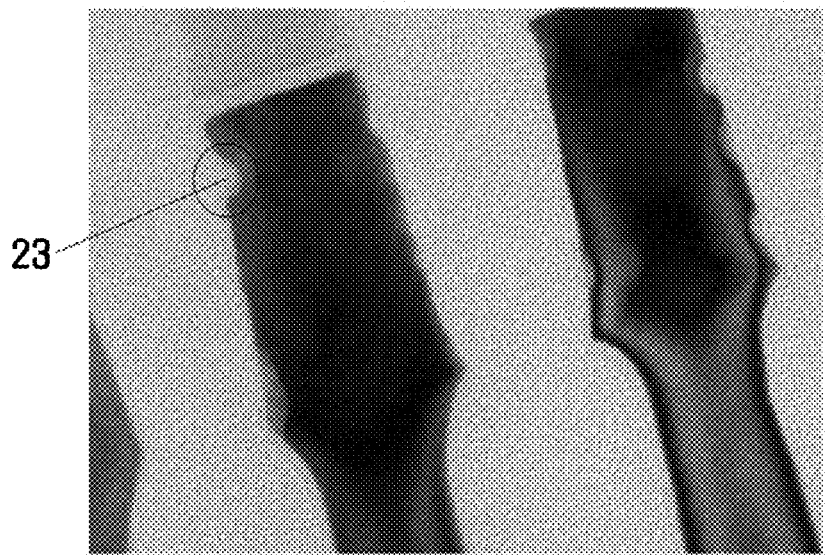
FIG. 6 is an electron microscopic picture showing a sidewall passivation layer formed on a sidewall of a pillar head.

Other objects and advantages of one or more embodiments can be understood by the following description, and become apparent with reference to one or more embodiments. In the drawings, like components having like functions have been provided with like reference symbols and numerals.

FIGS. 7A to 12B are diagrams depicting a semiconductor device having channels formed in a top-to-bottom direction, in various stages of fabricating the same. FIGS. 7A, 10A, 11A, and 12A are plan views of a semiconductor device in accordance with one or more embodiments. FIGS. 7B, 8, 9, 10B, 11B, and 12B are cross-sectional views taken along the line I-I' of FIGS. 7A, 10A, 11A, and 12A, respectively.

Figure 7A:
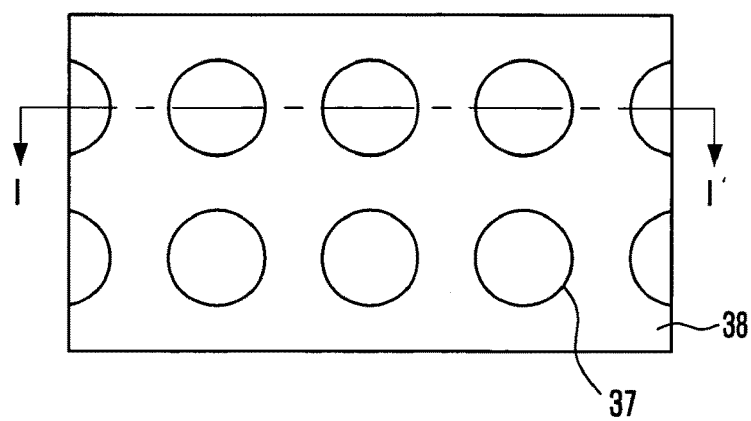
FIGS. 7A to 12B are diagrams depicting an embodiment of a semiconductor device having channels formed in a top-to-bottom direction, in various stages of fabricating the same.
Figure 7B:
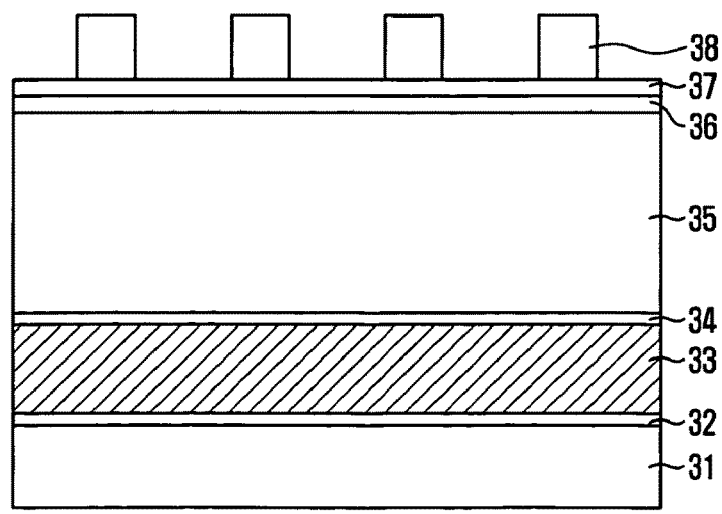

As shown in FIG. 7B, a first insulation layer 32, a conductive layer 33, and a second insulation layer 34 are sequentially formed on a substrate 31.

The conductive layer 33 is a thin film that functions as a gate electrode. The conductive layer 33 is formed of at least one material selected from the group consisting of polysilicon, tungsten silicide ($WSi_2$), titanium silicide ($TiSi_2$), tungsten (W), titanium nitride (TiN), tantalum (Ta), and tantalum nitride (TaN). For example, in one or more embodiments, the conductive layer 33 has a layered stack structure of tungsten titanium nitride layers, or a layered stack structure of tungsten, titanium nitride and polysilicon layers.

The first insulation layer 32 and the second insulation layer 34 are made of the same material, for example, a silicon oxide layer ($SiO_2$), a silicon oxynitride layer, an aluminum oxide layer ($Al_2O_3$), a tantalum oxide layer ($Ta_2O_5$), a zirconium oxide layer ($ZrO_2$), a hafnium oxide layer ($HfO_2$) and a radium oxide layer ($La_2O_3$). The second insulation layer 34 is formed to be thicker than the first insulation layer 32.

Then, an amorphous carbon layer 35, a silicon oxynitride layer (SiON) 36, an antireflection layer 37, and a photoresist pattern 38 are formed on the second insulation layer 34.

The photoresist pattern 38 is a hole type pattern and has a structure for opening a region where pillar patterns will be formed. This is further described in connection with the following processes.

Figure 8:
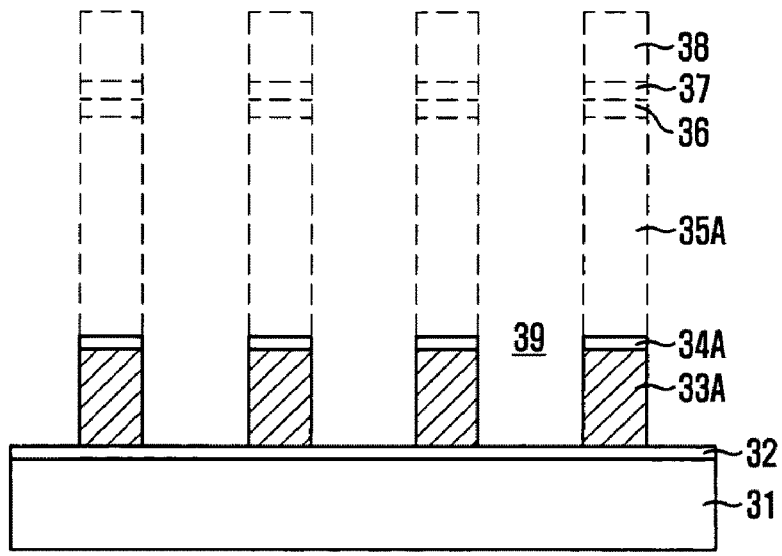

As shown in FIG. 8, the antireflection layer 37, the silicon oxynitride layer 36, and the amorphous carbon layer 35 are etched using the photoresist pattern 38 as an etch barrier.

Then, a plurality of opening regions 39 are formed by etching the second insulation layer 34 and the conductive layer 33 using the amorphous carbon pattern 35A which is formed by etching the amorphous carbon layer 35.

To be specific, etching stops at the surface of the second insulation layer 34 when the amorphous carbon layer 35 is etched. Then, the second insulation layer 34 and the conductive layer 33 are etched using the amorphous carbon layer pattern 35A as an etch barrier. The etching stops at the surface of the first insulation layer 32. Therefore, the opening regions 39 have the uniform height.

Hereinafter, the etched second insulation layer and the etched conductive layer are referred as a second insulation pattern 34A and a conductive layer pattern 33A.

Sidewalls of the second insulation pattern 34A and conductive later pattern 33A define the opening regions 39 and, in one or more embodiments, form an angle of 90° with respect to the substrate 31. In one or more embodiments, this angle is 70 to 110°.

The photoresist pattern 38, the antireflection layer 37, the silicon oxynitride layer 36, and the amorphous carbon layer pattern 35A are removed.

Figure 9:
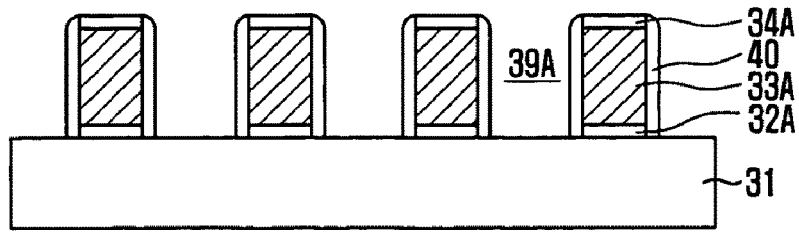

As shown in FIG. 9, a gate insulation layer 40 is formed on the sidewalls that define the opening regions 39, particularly, on a sidewall of the conducive layer pattern 33A.

The gate insulation layer 40 is formed by depositing a thin film over the substrate having the opening region 39 and performing an etch process on the entire surface of the substrate. Here, the thin film is a material selected from the group consisting of silicon oxide ($SiO_2$), silicon oxynitride, aluminum oxide ($Al_2O_3$), tantalum oxide ($Ta_2O_5$), zirconium oxide ($ZrO_2$), hafnium oxide ($HfO_2$) and radium oxide ($La_2O_3$). When the etch process is performed, the substrate 31 is exposed by etching the first insulation layer 32, and the etching of the first insulation layer 32 stops at the surface of the substrate 31.

When the first insulation layer 32 is etched while the etch process is performed after forming the thin film as described above, in one or more embodiments, the conductive layer pattern 33A is unintentionally exposed due to the loss of the second insulation layer pattern 34A. However, such an overexposure problem will sometimes not occur if the second insulation layer pattern 34A is formed sufficiently thicker than the first insulation layer 32.

Hereinafter, the etched first insulation layer is referred as a first insulation layer pattern 32A. Also, reference character 39A denotes the opening region in FIG. 9 because the opening region extends further due to the etching of the first insulation layer 32. Here, a plurality of expanded opening regions 39A have an uniform depth because etching stops at the surface of the substrate 31.

Then, an impurity region is formed by doping impurities at the substrate 31, and a buried bit line is formed by performing a separation process that divides the impurity region. The buried bit line is a date transfer line for inputting data to or outputting data from a capacitor in a semiconductor device.

Figure 10A:
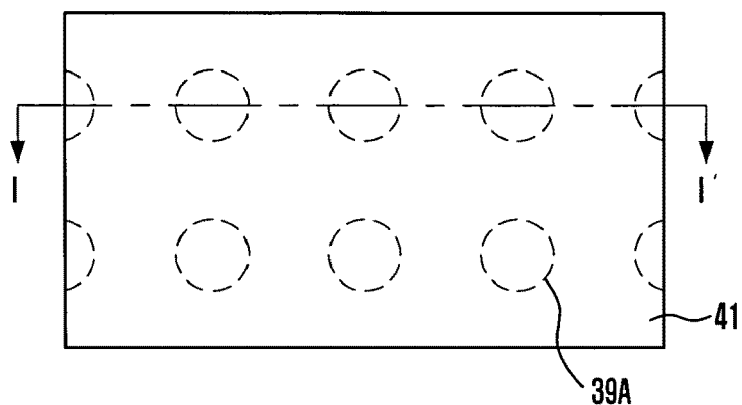
Figure 10B:
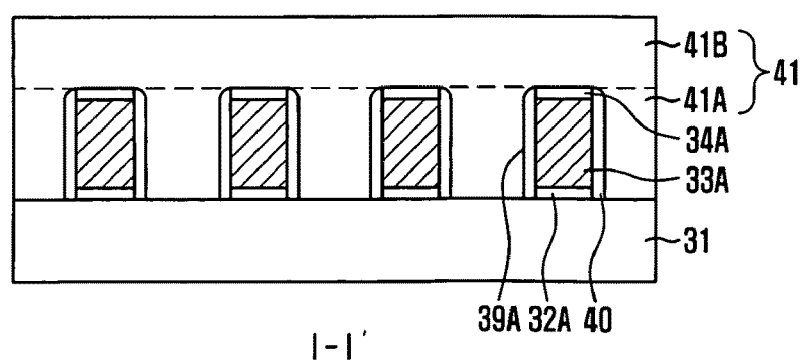

As shown in FIGS. 10A and 10B, the plurality of expanded opening regions 39A are filled by performing an epitaxial growth process, and a pillar pattern 41 is formed to cover the surface of the second insulation layer pattern 34A.

The pillar pattern 41 is formed of silicon (Si) crystals of the substrate, which are grown through the epitaxial growth process. The epitaxial growth process is performed until all of the expanded opening regions 39A are filled and the surface of the second insulation layer pattern 34A is covered. Then, the grown crystals are flattened by performing a planarization process such as an etch-back process or a chemical mechanical polishing process.

In one or more embodiments, the pillar pattern 41 is divided into a pillar neck 41A and a pillar head 41B. The pillar neck 41A is a growth layer formed in the expanded opening region 39A, and the pillar head 41B is a growth layer formed on the surface of the second insulation layer pattern 34A.

Impurity or native oxide is removed from the surface of the substrate 31 by performing a light etch treatment (LET) process as a precursor to the epitaxial growth process. The LET process is performed in a downstream type plasma etcher using a gas mixture of $CF_4$ and $O_2$.

Then, a source and a drain are formed by doping impurities on the pillar head 41B. The formed source and drain lead a channel in a top-to-bottom direction at the pillar pattern 41 with the buried bit line.

Figure 11A:
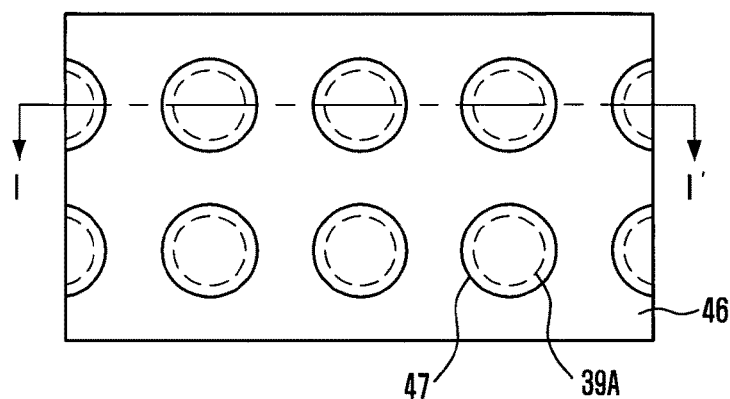
Figure 11B:
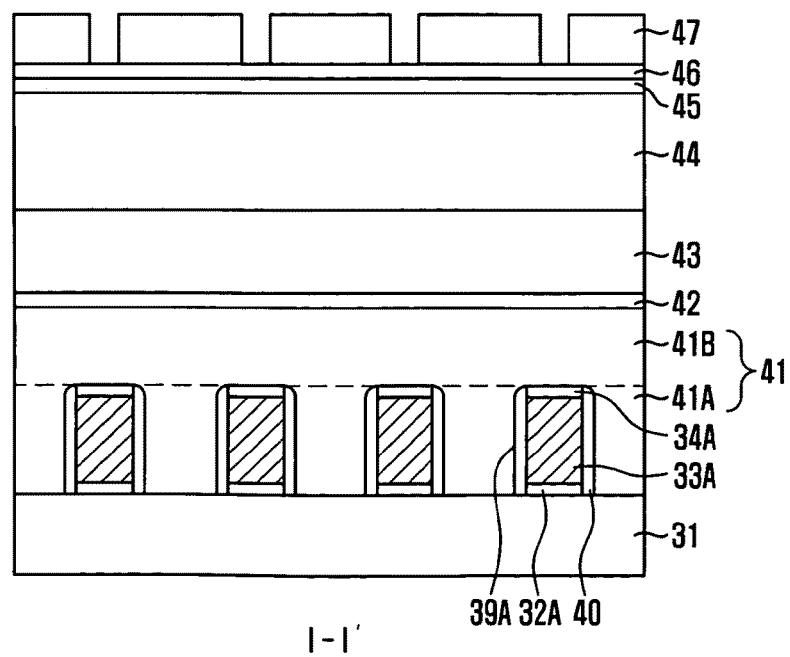

As shown in FIG. 11B, a pad oxide layer 42 and a gate hard mask layer 43 are sequentially formed over the resultant structure having the pillar pattern 41.

The gate hard mask layer 43 protects the pillar pattern 41 and is a thin film formed for patterning a lower layer. The gate hard mask layer 43 is made of a nitride layer, an oxide layer, or a stack structure of a nitride layer and an oxide layer. The pad oxide layer 42 is a thin film formed to relieve a thin film stress between the gate hard mask layer 43 and the pillar pattern 41.

Then, an amorphous carbon layer 44, a silicon oxynitride layer 45, an antireflection layer 46, and a photoresist pattern 47 are sequentially formed on the gate hard mask layer 43. In one or more other embodiments, a hard mask layer is formed between the gate hard mask layer 43 and the amorphous carbon layer 44 in order to effectively pattern the gate hard mask layer 43.

The photoresist pattern 47 includes an opening region for selectively etching the pillar pattern 41, particularly, the pillar head 41B and the conductive layer pattern 33A. In the depicted plan view, the photoresist pattern 47 has a circular pattern with a diameter larger than a diameter of the pillar neck 41A. In one or more embodiments, an axis of the cylindrical pillar neck 41A and an axis of the cylindrical photoresist pattern 47 are the same.

Figure 12A:
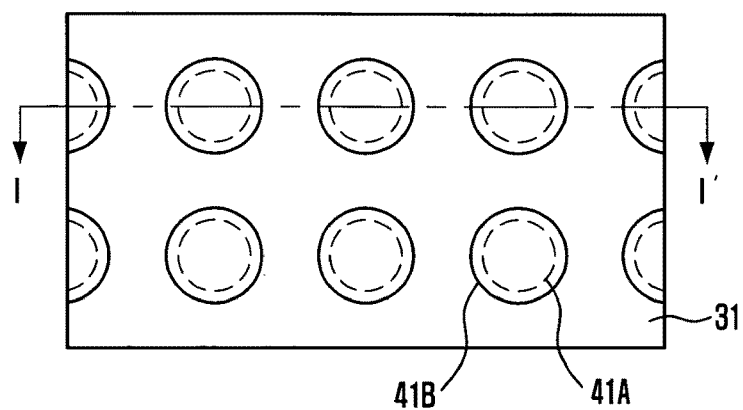
Figure 12B:
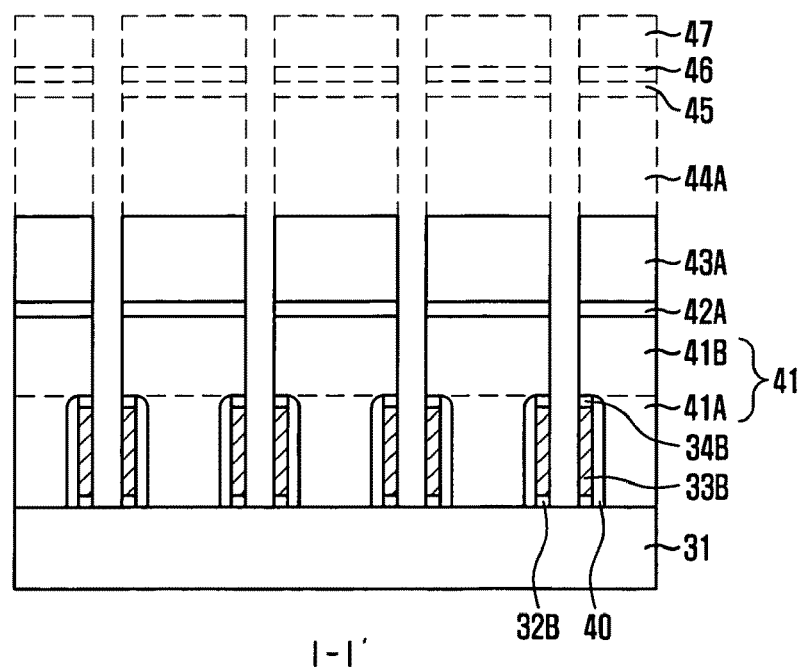

As shown in FIG. 12B, the antireflection layer 46, the silicon oxynitride layer 45, and the amorphous carbon layer 44 are etched using the photoresist pattern 47 as an etch barrier.

Then, the gate hard mask layer 43 and the pad oxide layer 42 are etched using the amorphous carbon layer pattern 44A, which is formed by etching the amorphous carbon layer 44, as an etch barrier. After etching, the pillar head 41B, the second insulation layer pattern 34A, the conductive layer pattern 33A, and the first insulation layer pattern 32A are etched using the gate hard mask pattern 43A as an etch barrier. Here, the gate hard mask pattern 43 and the lower layers thereof are etched in in-situ or in ex-situ.

To be specific, the pillar head 41B is etched using the gate hard mask pattern 43A as an etch barrier, and the etching stops at the surface of the second insulation layer pattern 34A. Then, the second insulation layer pattern 34A and the conductive layer pattern 33A are etched using the same etch barrier. Here, the etching stops at the surface of the first insulation layer pattern 32A. Then, the first insulation layer pattern 32A is etched, and the etching stops at the surface of the substrate 31.

According to the etching processes as described above, the gate insulation layer 40 is formed on a sidewall of the pillar neck 41A, the gate electrode 33B is formed by etching the conductive layer pattern 33A, the pillar head pattern 41B is formed corresponding to each pillar neck 41A, and the gate hard mask pattern 43A is formed for protecting an upper region of the pillar pattern 41. In the depicted plan view, the gate insulation layer 40 and the gate electrode 33B have a shape that surrounds the pillar neck 41A.

Then, the photoresist pattern 47, the antireflection layer 46, the silicon oxynitride layer 45, and the amorphous carbon layer pattern 44A are removed.

After removing, a capacitor is formed to be adjoined to the source and the drain formed on the pillar head pattern 41B. Hereby, the semiconductor device is formed with a channel in a top-to-bottom direction.

As described above, in one or more embodiments, the pillar pattern 41 is formed through growth, not etching of the substrate 31, and the pillar head pattern 41B is formed after forming the pillar neck 41A. Therefore, it is possible to prevent the pillar pattern 41 from falling down.

Also, the expanded opening region 39A is formed to have a uniform height and, accordingly, the pillar pattern 41 formed on the expanded opening region 39A has a uniform height. Furthermore, one or more embodiments prevent a reduced pattern uniformity caused by isotropically etching the pillar neck 41A by forming the pillar neck 41A through an anisotropic etching process. Moreover, it is possible to prevent the generation of voids and seams by burying the conductive layer because depositing the conductive layer 33, forming the pillar pattern 41, and patterning the conductive layer 33 are performed in sequence to generate the gate electrode 33B. Therefore, damage of the gate insulation 40 and the substrate 31 is prevented.

Moreover, in one or more embodiments, a uniform channel length is secured by the pillar neck 41A with improved pattern uniformity. Also, in one or more embodiments, the channel length is conveniently changed by changing a deposition thickness of the conductive layer 33.

As described above, one or more embodiments prevent the pillar pattern tipping to the side or falling down. One or more embodiments prevent damage to the substrate due to the void and seam occurring during the conductive depositing process. Accordingly, one or more embodiments provide a uniform channel length. Therefore, one or more embodiments improve reliability and security of the semiconductor device having a line width under 40 nm, and the yield of the semiconductor fabrication process is increased.

While one or more specific embodiments have been described, it will be apparent to those skilled in the art that various changes and modifications may be made.

What is claimed is:

1. A method for fabricating a semiconductor device, comprising:
preparing a substrate;
forming a plurality of conductive layer patterns on the substrate;
forming a gate insulation layer on sidewalls of the conductive layer patterns;
forming a pillar neck pattern between the conductive layer patterns;
forming a pillar head over the pillar neck pattern and the conductive layer patterns; and
forming a gate electrode surrounding the pillar neck pattern and forming a pillar head pattern by etching partial portions of the conductive layer patterns and the pillar head neck pattern until the substrate is exposed.

2. The method of claim 1, wherein the pillar neck pattern and the pillar head are formed through a growth process.

3. The method of claim 2, wherein the growth process is an epitaxial growth process.

4. The method of claim 1, wherein the plurality of conductive layer patterns are formed by performing an etch process using a hole type photoresist pattern as an etch barrier.

5. The method of claim 1, wherein the forming of the gate electrode is performed using a photoresist pattern that covers an upper portion of the pillar neck pattern and has a circular shape extending from the pillar neck pattern as a center.

6. The method of claim 1, further comprising:
performing a light etch treatment (LET) process before forming the pillar neck pattern.

7. A method for fabricating a semiconductor device, comprising:
preparing a substrate;
forming a first etch stop layer, a conductive layer, a second etch stop layer, and a plurality of hard mask patterns;
forming a plurality of opening regions by etching the second etch stop layer, the conductive layer, and the first etch stop layer using the plurality of hard mask patterns as an etch barrier;
removing the plurality of hard mask patterns;
forming a gate insulation layer on sidewalls defining the plurality of opening regions;

forming a plurality of pillar patterns in the plurality of opening regions;

forming a gate hard mask pattern that covers a portion of the conductive layer and the plurality of pillar patterns; and forming a gate electrode surrounding each of the plurality of pillar patterns by etching partial portions of the conductive layer between the plurality of pillar patterns using the gate hard mask pattern until the substrate is exposed.

8. The method of claim 7, wherein the plurality of pillar patterns are formed through a growth process.

9. The method of claim 8, wherein the growth process is an epitaxial growth process.

10. The method of claim 7, further comprising:

performing a light etch treatment (LET) process before forming the plurality of pillar patterns.

11. The method of claim 7, wherein a hole type photoresist pattern is used for forming the plurality of hard mask patterns.

12. The method of claim 11, wherein etching stops at a surface of the second etch stop layer when the plurality of hard mask patterns are formed.

13. The method of claim 7, wherein the plurality of opening regions are formed by:

etching the second etch stop layer and the conductive layer using the plurality of hard mask patte~ patterns as an etch barrier to stop etching at a surface of the first etch stop layer; and etching the first etch stop layer using the plurality of hard mask patterns as an etch barrier to stop etching at a surface of the substrate.

14. The method of claim 7, wherein the gate hard mask pattern has a plurality of circular patterns that cover an upper portion of the plurality of pillar patterns, the plurality of circular patterns have axes, the plurality of pillar patterns have axes, and the axes of ones of the plurality of circular patterns and ones of the plurality of pillar patterns are the same.

* * * * *